US012456701B2

(12) United States Patent
Preisler et al.

(10) Patent No.: US 12,456,701 B2
(45) Date of Patent: Oct. 28, 2025

(54) EFFICIENT INTEGRATION OF A FIRST SUBSTRATE WITHOUT SOLDER BUMPS WITH A SECOND SUBSTRATE HAVING SOLDER BUMPS

(71) Applicant: Newport Fab, LLC, Newport Beach, CA (US)

(72) Inventors: Edward Preisler, San Clemente, CA (US); Zhirong Tang, Lake Oswego, OR (US)

(73) Assignee: Newport Fab, LLC, Newport Beach, CA (US)

( * ) Notice: Subject to any disclaimer, the term of this patent is extended or adjusted under 35 U.S.C. 154(b) by 554 days.

(21) Appl. No.: 17/967,107

(22) Filed: Oct. 17, 2022

(65) Prior Publication Data

US 2024/0128209 A1   Apr. 18, 2024

(51) Int. Cl.
*H01L 23/00* (2006.01)
*H01L 23/29* (2006.01)
*H01L 23/31* (2006.01)

(52) U.S. Cl.
CPC ............ *H01L 24/05* (2013.01); *H01L 23/291* (2013.01); *H01L 23/3171* (2013.01); *H01L 23/3192* (2013.01); *H01L 24/03* (2013.01); *H01L 24/13* (2013.01); *H01L 24/16* (2013.01); *H01L 2224/03614* (2013.01); *H01L 2224/05005* (2013.01); *H01L 2224/05083* (2013.01); *H01L 2224/05541* (2013.01);
(Continued)

(58) Field of Classification Search
CPC ... H01L 24/05; H01L 23/291; H01L 23/3171; H01L 23/3192; H01L 24/03; H01L 24/13; H01L 24/16; H01L 2224/03614; H01L 2224/05005; H01L 2224/05083; H01L 2224/05541; H01L 2224/05557; H01L 2224/05655; H01L 2224/05669; H01L 2224/13139; H01L 2224/13144; H01L 2224/16012; H01L 2224/16145; H01L 2224/16227; H01L 2224/16238; H01L 2924/3701; H01L 2224/16225; H01L 24/81; H01L 24/11
See application file for complete search history.

(56) References Cited

U.S. PATENT DOCUMENTS 9,761,542 B1 * 9/2017 Sylvestre ............ B23K 1/0016
2011/0233793 A1 * 9/2011 Miura .................... H01L 24/05
228/208

(Continued)

*Primary Examiner* — Douglas W Owens
(74) *Attorney, Agent, or Firm* — Farjami & Farjami LLP

(57) ABSTRACT

A method of forming a semiconductor structure having a first substrate capable of electrically and mechanically connecting to a second substrate includes providing a first substrate without a solder bump. A solder bump receiving metal is formed over a top interconnect metal of the first substrate. The solder bump receiving metal may include platinum, a platinum alloy, nickel, or a nickel alloy. A passivation layer is formed, wherein the passivation layer is not situated under any portion of the solder bump receiving metal. A window is formed exposing a portion of the solder bump receiving metal. The method may further include providing a second substrate with a second substrate solder bump. The second substrate solder bump may be mechanically and electrically connecting to the exposed portion of the solder bump receiving metal of the first substrate.

20 Claims, 7 Drawing Sheets

(52) U.S. Cl.
CPC ............ *H01L 2224/05557* (2013.01); *H01L 2224/05655* (2013.01); *H01L 2224/05669* (2013.01); *H01L 2224/13139* (2013.01); *H01L 2224/13144* (2013.01); *H01L 2224/16012* (2013.01); *H01L 2224/16145* (2013.01); *H01L 2224/16227* (2013.01); *H01L 2224/16238* (2013.01); *H01L 2924/3701* (2013.01)

(56) References Cited

U.S. PATENT DOCUMENTS

| | | | | |
|---|---|---|---|---|
| 2011/0260316 | A1* | 10/2011 | Jang | H01L 24/13 |
| | | | | 257/737 |
| 2012/0326298 | A1* | 12/2012 | Lu | H01L 24/03 |
| | | | | 257/737 |
| 2013/0187277 | A1* | 7/2013 | Chen | H01L 24/05 |
| | | | | 257/762 |

* cited by examiner

FIG. 1 --Prior Art--

EFFICIENT INTEGRATION OF A FIRST SUBSTRATE WITHOUT SOLDER BUMPS WITH A SECOND SUBSTRATE HAVING SOLDER BUMPS

BACKGROUND

Solder bumps are commonly utilized in semiconductor structures to mechanically and electrically connect devices in different substrates. Such connection can assist with pixel readout, signal processing, memory storage, etc. However, a complex, time consuming, and expensive fabrication process is required to provide a processed wafer with solder bumps.

In order to connect to solder bumps, the processed wafer is often equipped with under-bump metallizations (UBMs) over the top interconnect metals to provide metallurgical compatibility with solder bumps. However, UBMs disadvantageously increase fabrication complexity. Forming UBMs in processed wafers adds several processing steps. Due to the types of materials used, the processed wafer is often transferred to a second specialized foundry in order to form UBMs and connect them to solder bumps. Overall, forming UBMs and making the processed wafers compatible with solder bumps can add approximately two to three months to the fabrication process.

Thus, there is a need in the art for a technique to efficiently form a semiconductor structure capable of electrically and mechanically connecting to solder bumps.

SUMMARY

The present disclosure is directed to efficient integration of a first substrate without solder bumps with a second substrate having solder bumps, substantially as shown in and/or described in connection with at least one of the figures, and as set forth in the claims.

DETAILED DESCRIPTION

Figure 1:
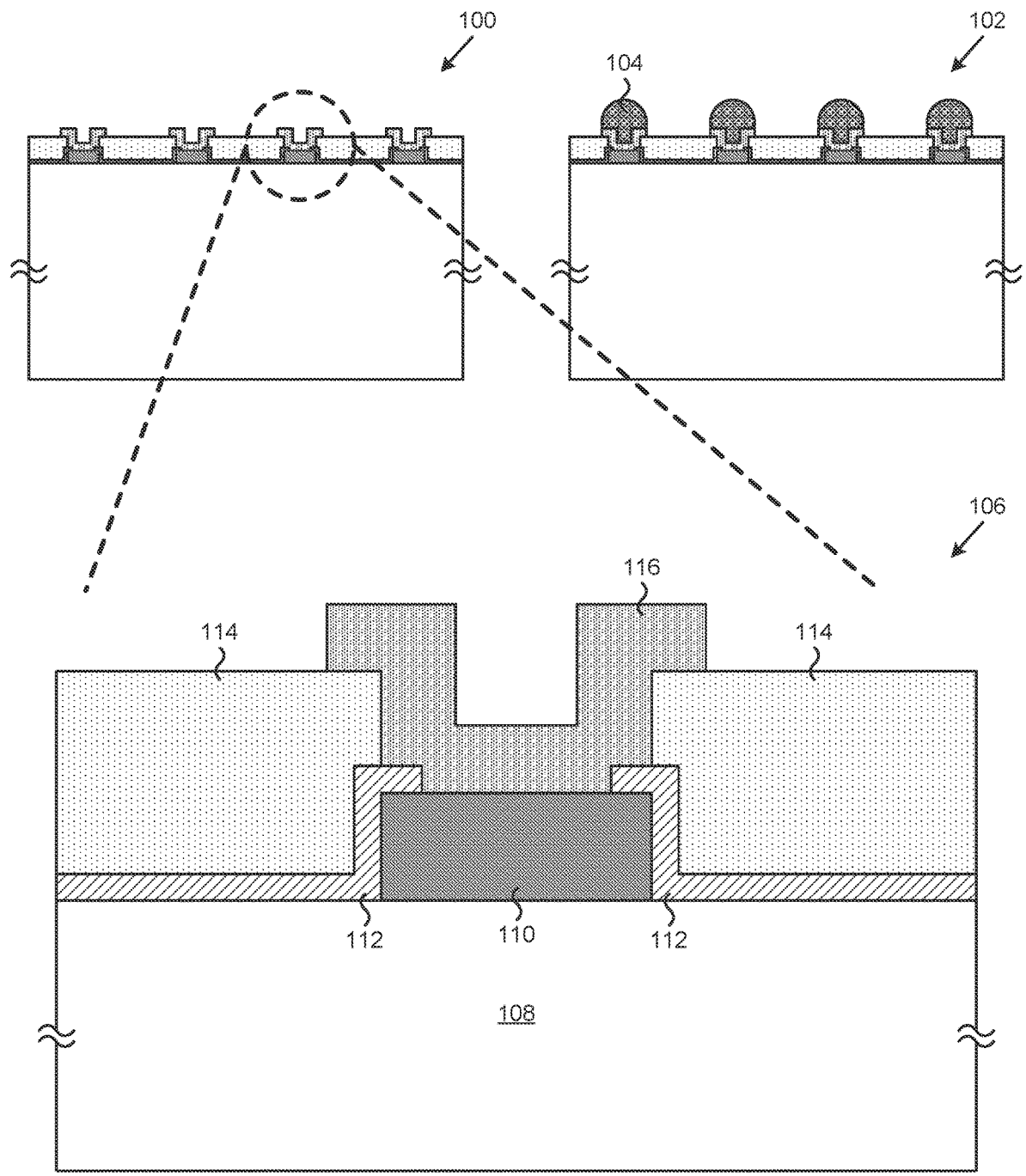
FIG. 1 illustrates conventional first and second substrates, and an enlarged view of a first substrate portion of the first substrate.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates conventional first substrate 100 and second substrate 102, and an enlarged view of first substrate portion 106 of first substrate 102. First substrate 100 and second substrate 102 generally represent any two substrates intended to be electrically and mechanically connected to each other. For example, first substrate 100 can be a photonics substrate, a bipolar complementary metal oxide semiconductor (BiCMOS) substrate, a sensor substrate, a microelectromechanical systems (MEMS) substrate, etc. Second substrate 102 can be an interposer, a printed circuit board (PCB), a microprocessor, a memory device, etc. First substrate 100 and second substrate 102 can include active and passive devices (not shown in FIG. 1).

As shown in FIG. 1, second substrate 102 has second substrate solder bumps 104. In the present implementation, solder bumps are situated on a top side of second substrate 102. Second substrate solder bumps 104 can be any solder bumps known in the art. For example, second substrate solder bumps 104 can be a gold alloy or a silver alloy, such as gold/tin (AuSn) or silver/tin (AgSn). Second substrate solder bumps 104 enable mechanically and electrically connecting second substrate 102 with another semiconductor structure, such as first substrate 100.

However, second substrate solder bumps 104 are generally metallurgically incompatible with top interconnect metals of first substrate 100, as described below. In order to connect first substrate 100 and second substrate 102 using second substrate solder bumps 104, the processed wafer that includes first substrate 100 undergoes an under-bump metallization (UBM) process over the top interconnect metals of the processed wafer. An exemplary portion of substrate 100 is illustrated by first substrate portion 106 in FIG. 1. First substrate portion 106 includes lower substrate region 108, top interconnect metal 110, passivation layer 112, protective layer 114, and UBM 116.

Lower substrate region 108 can include a back-end-of-line (BEOL) multi-level metallization (MLM), and generally any layers of first substrate 100 below top interconnect metal 110. In various implementations, lower substrate region 108 can comprise silicon (Si), silicon-on-insulator (SOI), germanium (Ge), silicon germanium ($Si_XGe_Y$), silicon carbide ($Si_XC_Y$), or a group III-V semiconductor. A BEOL MLM can include one or more interlayer metal levels for electrical routing through first substrate 100, and one or more interlayer dielectrics that provide insulation between the interlayer metal levels. Interconnect metals and passive devices can be formed in the interlayer metal levels, and vias can be formed in the interlayer dielectrics, top interconnect metals are the last routing layer. The various layers of lower substrate region 108 are not specifically illustrated in FIG. 1.

Top interconnect metal 110 represents a metal in the last or uppermost interlayer metal level of a BEOL MLM of first substrate 100. For example, top interconnect metal 110 can be a metal from metal level seven (M7) of a BiCMOS substrate, or a metal from metal level three (M3) of a photonics substrate. In various implementations, top interconnect metal 110 can include tungsten (W), aluminum (Al), or copper (Cu).

Passivation layer 112 is situated over top interconnect metal 110 and lower substrate region 108. Passivation layer 112 is an electrically insulating layer. In various implementations, passivation layer 112 can include a semiconductor-based dielectric such as silicon oxide ($Si_XO_Y$), silicon nitride ($Si_XN_Y$), or silicon oxynitride ($Si_XO_YN_Z$). A window in passivation layer 112 exposes a portion of top interconnect metal 110 for electrical connection.

Although first substrate 100 is substantially complete after forming a window in passivation 112, second substrate solder bumps 104 are generally metallurgically incompatible with top interconnect metals 110 of first substrate 100. Metals commonly used in second substrate solder bumps 104 often do not adhere well to metals commonly used in top interconnect metals 110. Low conductivity intermetallics also tend to form at the interface of second substrate solder bumps 104 with top interconnect metals 110. Additionally, low conductivity oxides tend to form at exposed areas of top interconnect metals 110. As a result, first substrate 100 and second substrate 200 cannot be connected at this stage of processing despite that first substrate 100 is substantially complete.

In order to connect first substrate 100 and second substrate 102 using second substrate solder bumps 104, UBMs 116 are formed on first substrate 100 over top interconnect metals 110 and protective layer 114. UBMs 116 provide metallurgical compatibility with second substrate solder bumps 104, and can provide a larger area of exposed metal to facilitate connecting second substrate solder bumps 104. However, UBMs 116 disadvantageously increase fabrication complexity. To form UBMs 116, protective layer 114 is formed over passivation layer 112 and top interconnect metal 110. In various implementations, protective layer 114 can include an organic dielectric or polymer such as polybenzoxazole (PBO), polyimide (PI), or benzocyclobutene (BCB). Protective layer 114 can then be planarized. Then, a mask is formed over protective layer 114. The mask is then utilized to pattern a window in protective layer 114, re-exposing top interconnect metal 110.

Next, a metal layer is deposited over protective layer 114 and in the window over top interconnect metal 110. The metal layer is then patterned to form UBMs 116, for example, by etching or lift-off, which can require an additional mask. In various implementations, UBMs 116 can include a metal that adheres well to and does not oxidize with second substrate solder bumps 104, such as platinum (Pt), nickel (Ni), chromium (Cr), gold (Au), or alloys thereof. The first substrate 100 can then be connected to second substrate 102 by soldering second substrate solder bumps 104 to UBMs 116.

As described above, forming UBMs 116 and making first substrate 100 in a processed wafer compatible with second substrate solder bumps 104 can add several steps to a fabrication process, including two additional deposition steps, two additional masking steps, and two addition patterning steps. Moreover, metals such as Au, Ag, and Cr are typically not used in CMOS foundries, for example, due to risks of device contamination. Accordingly, the processed wafer that includes first substrate 100 is often transferred to a second specialized foundry in order to form UBMs 116 and connect them to second substrate solder bumps 104. Overall, forming UBMs 116 and making first substrate 100 compatible with second substrate solder bumps 104 can add approximately two to three months to the fabrication process.

Figure 2:
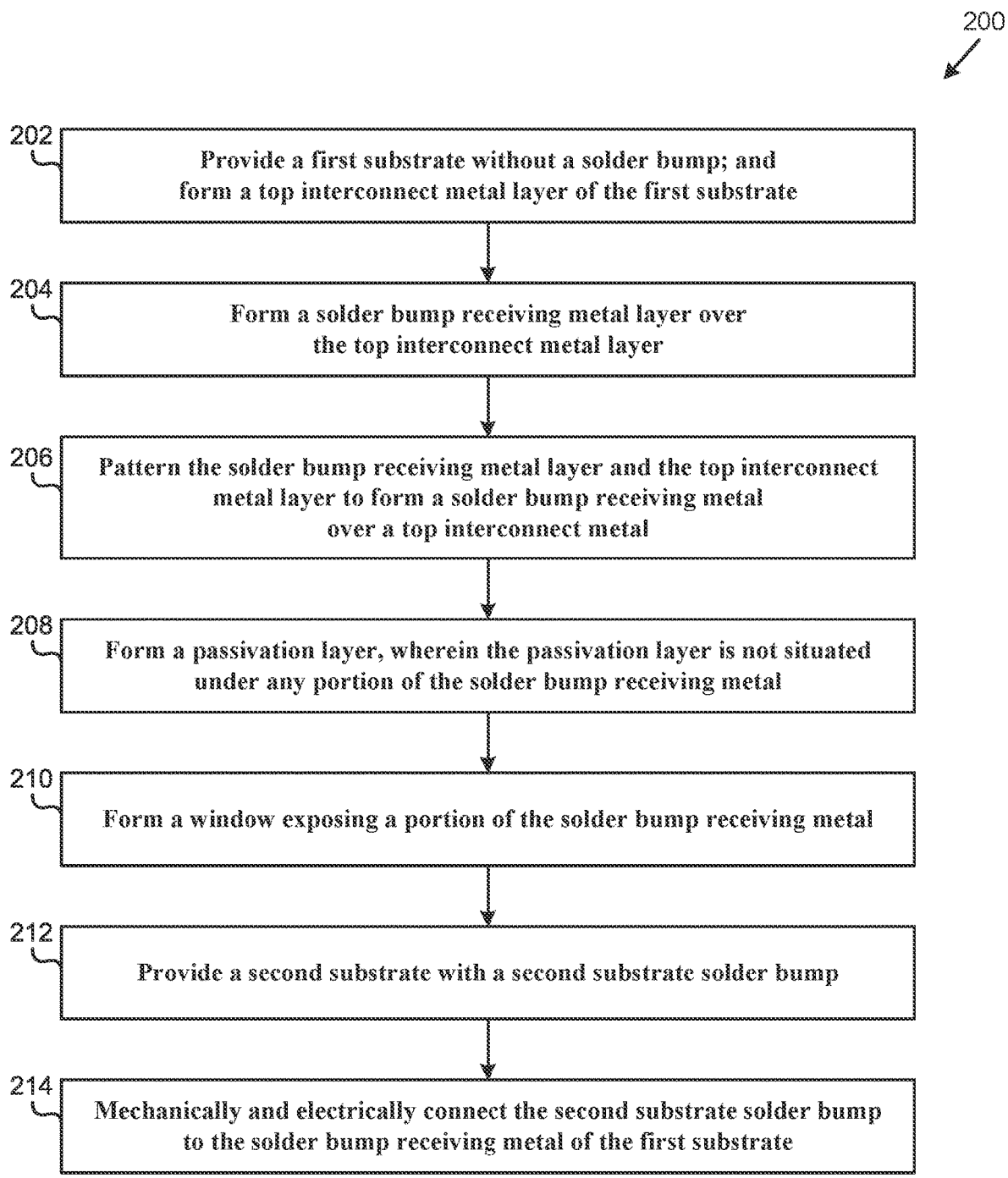
FIG. 2 illustrates a flowchart of an exemplary method for forming a semiconductor structure according to one implementation of the present application.
Figure 3:
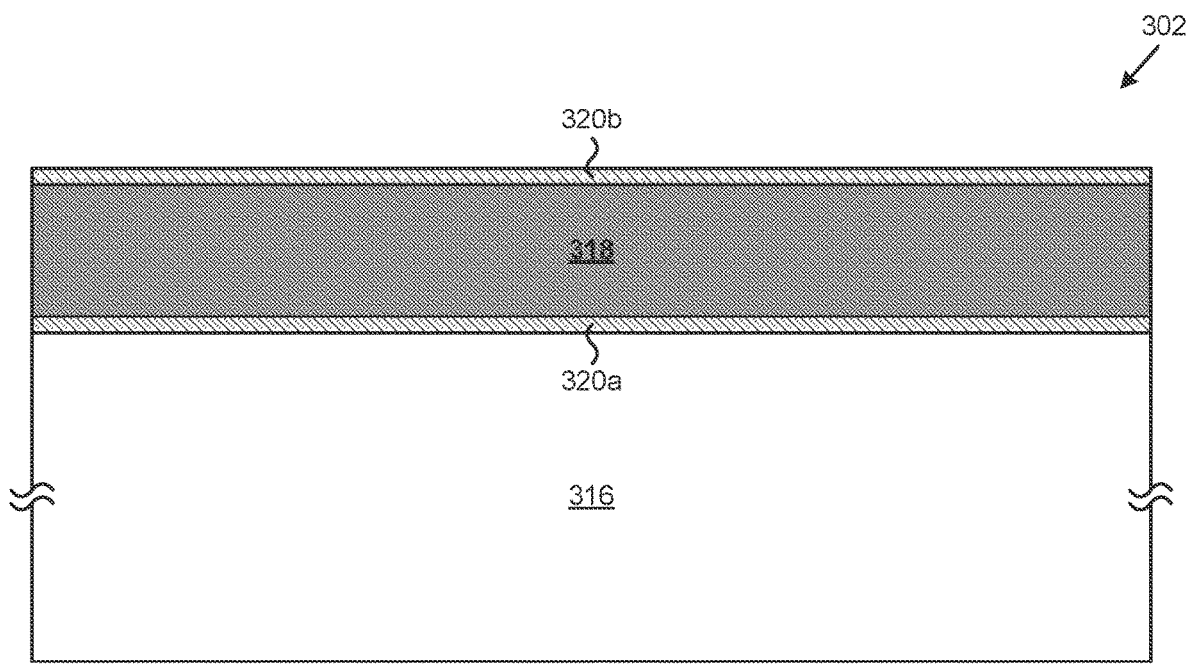
FIG. 3 illustrates a semiconductor structure processed in accordance with the flowchart of FIG. 1 according to one implementation of the present application.
Figure 4:
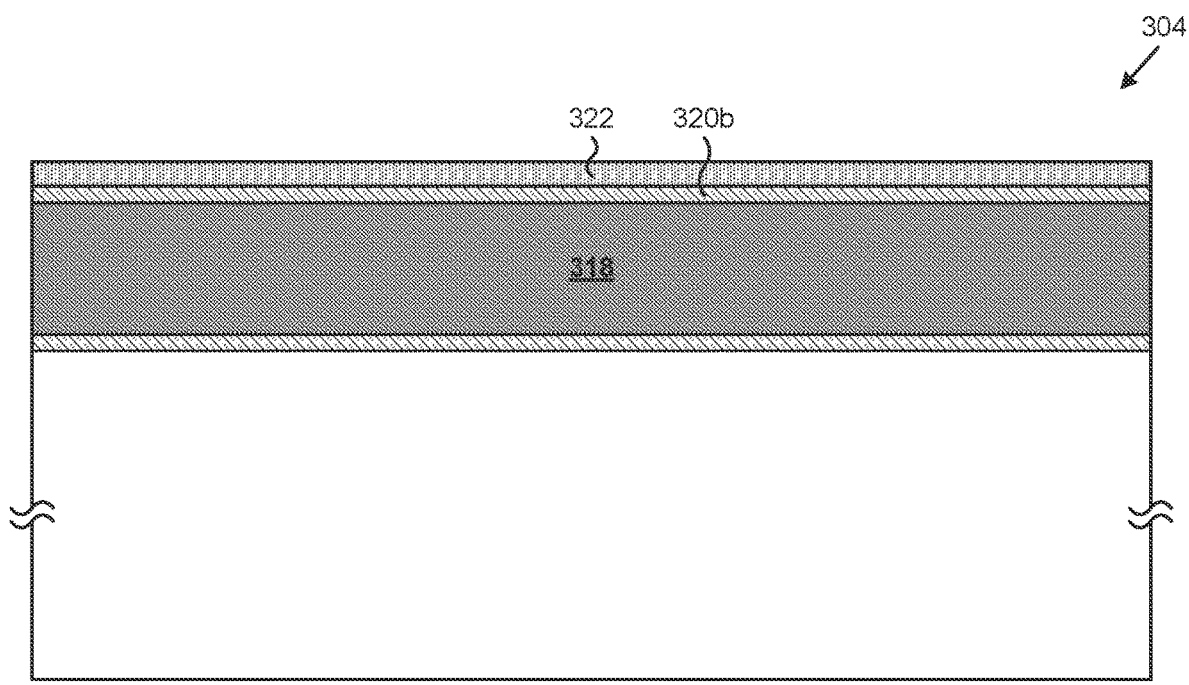
FIG. 4 illustrates a semiconductor structure processed in accordance with the flowchart of FIG. 1 according to one implementation of the present application.

FIG. 2 illustrates a flowchart of an exemplary method for forming a semiconductor structure according to one implementation of the present application. Structures shown in FIGS. 3 through 9 illustrate the results of performing actions 202 through 214 shown in flowchart 200 of FIG. 2. For example, FIG. 3 shows a semiconductor structure after performing action 202 in FIG. 2, FIG. 4 shows a semiconductor structure after performing action 204 in FIG. 2, and so forth.

Actions 202 through 214 shown in flowchart 200 of FIG. 2 are sufficient to describe one implementation of the present inventive concepts. Other implementations of the present inventive concepts may utilize actions different from those shown in the flowchart of FIG. 2. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 3 illustrates a semiconductor structure processed in accordance with action 202 in the flowchart of FIG. 2 according to one implementation of the present application. As shown in FIG. 3, first substrate 302 is provided without a solder bump, and top interconnect metal layer 318 of first substrate 302 is formed. First substrate 302 includes lower substrate region 316, top interconnect metal layer 318, and optional barrier metal layers 320a and 320b.

Lower substrate region 316 in FIG. 3 generally corresponds to lower substrate region 108 in FIG. 1, and may have any implementations described above. Lower substrate region 316 can include a semiconductor wafer, a BEOL MLM, and generally any layers of first substrate 302 below top interconnect metal layer 318. Top interconnect metal layer 318 represents a metal in the last or uppermost interlayer metal level of a BEOL MLM of first substrate 302. In various implementations, top interconnect metal layer 318 can include tungsten (W), aluminum (Al), or copper (Cu). In various implementations, top interconnect metal layer 318 can have a thickness of approximately one micron (1 μm) to five microns (5 μm).

Optional barrier metal layers 320a and 320b can function to improve adhesion of, or otherwise reduce nonconformities of, top interconnect metal layer 318. Optional barrier metal layer 320a can be formed before and under top interconnect metal layer 318. Similarly, optional barrier metal layer 320b can be formed after and over top interconnect metal layer 318. Top interconnect metal layer 318 and optional barrier metal layers 320a and 320b can be provided, for example, by physical vapor deposition (PVD) or chemical vapor deposition (CVD) techniques.

Optional barrier metal layers 320a and 320b can include, for example, titanium (Ti), titanium nitride (TiN), tantalum (Ta), or tantalum nitride (TaN). In various implementations, optional barrier metal layers 320a and 320b can each have a thickness of approximately three hundred angstroms (300 Å) to one thousand angstroms (1,000 Å). In various implementations, optional barrier metal layers 320a and 320b can comprise multiple layers. For example, optional barrier metal layer 320a can comprise a Ti layer having a thickness of approximately three hundred angstroms (300 Å) under a TiN layer having a thickness of approximately six hundred angstroms (600 Å).

FIG. 4 illustrates a semiconductor structure processed in accordance with action 204 in the flowchart of FIG. 2 according to one implementation of the present application. As shown in FIG. 4, in first substrate 304, solder bump receiving metal layer 322 is formed over top interconnect metal layer 318 (or over optional barrier metal layer 320b).

Solder bump receiving metal layer 322 comprises a material metallurgically compatible with a second substrate solder bump (not shown in FIG. 4), such that a portion of solder bump receiving metal layer 322 of first substrate 304 is capable of electrically and mechanically connecting to the second substrate solder bump. Preferably, solder bump receiving metal layer 322 comprises a material that adheres well to metals commonly used in second substrate solder bumps, and that eliminates or significantly reduces formation of low conductivity intermetallics at an interface with second substrate solder bumps. The material also preferably eliminates or significantly reduces formation of low conductivity oxides at areas exposed to air.

In one implementation, solder bump receiving metal layer 322 comprises platinum (Pt). In various implementations, solder bump receiving metal layer 322 comprises a platinum alloy, nickel (Ni), or a nickel alloy. In various implementations, solder bump receiving metal layer 322 can have a thickness of approximately one hundred angstroms (100 Å) to one thousand angstroms (1,000 Å).

Figure 5:
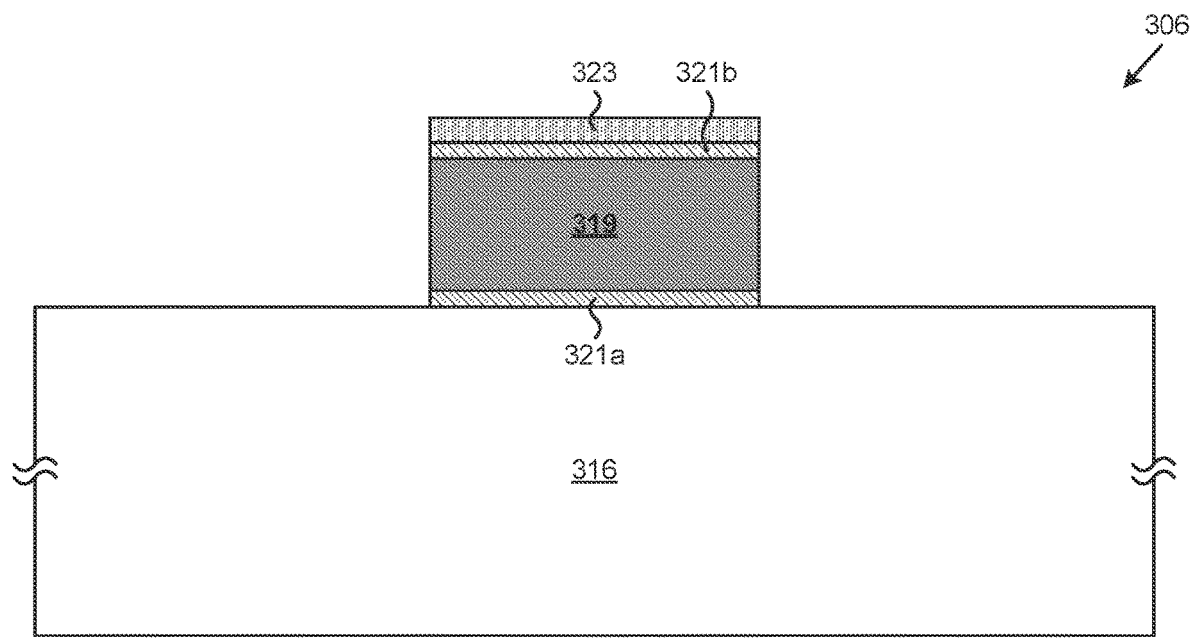
FIG. 5 illustrates a semiconductor structure processed in accordance with the flowchart of FIG. 1 according to one implementation of the present application.

FIG. 5 illustrates a semiconductor structure processed in accordance with action 206 in the flowchart of FIG. 2 according to one implementation of the present application. As shown in FIG. 5, in first substrate 306, solder bump receiving metal layer 322 (shown in FIG. 4) and top interconnect metal layer 318 (shown in FIG. 4) are patterned to form solder bump receiving metal 323 over top interconnect metal 319. The optional barrier metal layers are also patterned to form optional barrier metals 321a and 321b.

Patterning solder bump receiving metal 323, top interconnect metal 319, and optional barrier metals 321a and 321b in FIG. 5 can utilize any metal patterning technique known in the art, such as a chemical wet etch. In the present implementation, solder bump receiving metal 323, top interconnect metal 319, and optional barrier metals 321a and 321b are substantially concurrently patterned. As used herein, "substantially concurrently patterning" refers to layers being patterned by the same action without intervening actions such as mask removal or changing etch chemistries, even though an upper layer may technically be finished patterning before a lower layer.

For example, the metal stack can be etched down to lower substrate region 316 using a single mask. Accordingly, solder bump receiving metal 323, top interconnect metal 319, and optional barrier metals 321a and 321b can have approximately the same width. As used herein, "approximately the same width" refers to two layers having a similar width, except for normal sidewall angling and other process variations associated with patterning. The width can be chosen such that solder bump receiving metal 323 is slightly wider than the second substrate solder bump it is supposed to receive. In one implementation, the width of solder bump receiving metal 323 is approximately thirty microns (30 µm). In other implementations, solder bump receiving metal 323, top interconnect metal 319, and optional barrier metals 321a and 321b are not concurrently patterned, and can have different widths.

Figure 6:
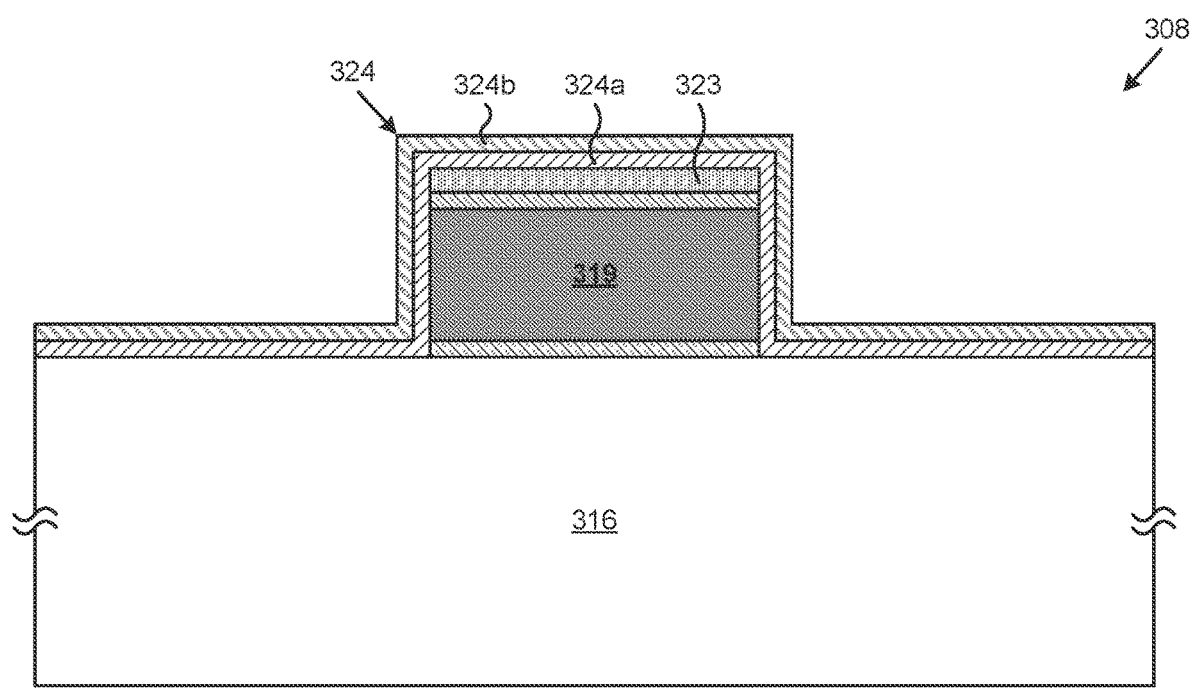
FIG. 6 illustrates a semiconductor structure processed in accordance with the flowchart of FIG. 1 according to one implementation of the present application.

FIG. 6 illustrates a semiconductor structure processed in accordance with action 208 in the flowchart of FIG. 2 according to one implementation of the present application. As shown in FIG. 6, in first substrate 308, passivation layer 324 is formed, wherein passivation layer 324 is not situated under any portion of solder bump receiving metal.

Passivation layer 324 is formed over solder bump receiving metal 323, on sidewalls of the patterned metal stack, and over lower substrate region 316. Passivation layer 324 can be formed by conformal deposition over first substrate 308, for example, by physical vapor deposition (PVD) or chemical vapor deposition (CVD) techniques. In various implementations, passivation layer 324 can include a semiconductor-based dielectric such as $Si_xO_y$, $Si_xN_y$, or $Si_xO_yN_z$. In various implementations, passivation layer 324 can have a thickness of approximately fifty angstroms (50 Å) to two hundred angstroms (200 Å).

In the present implementation, passivation layer 324 comprises multiple passivation layers 324a and 324b. In one implementation, passivation layer 324a can comprise a $Si_xO_y$ layer having a thickness of approximately twenty five angstroms (25 Å) to one hundred angstroms (100 Å) under passivation layer 324b that can comprise a $Si_xN_y$ layer having a thickness of approximately twenty five angstroms (25 Å) to one hundred angstroms (100 Å).

Notably, solder bump receiving metal 323 is formed prior to and lies under passivation layer 324. As such, passivation layer 324 is not situated under any portion of solder bump receiving metal 323. Rather, passivation layer 324 is situated over and on the sidewalls of solder bump receiving metal 323. It is noted that passivation layer 324 "not situated under any portion of" solder bump receiving metal 323 in FIG. 6 refers to passivation layer 324 not being under solder bump receiving metal 323 along a vertical axis, in an orientation first substrate 308 would have when passivation layer 324 is formed (e.g., the orientation with lower substrate region 316 down and top interconnect metal 319 up).

In contrast to first substrate 308 in FIG. 6, in first substrate portion 106 in FIG. 1, UBM 116 is formed after and over both protective layer 114 and passivation layer 112. As such, both protective layer 114 and passivation layer 112 are situated under portions of UBM 116.

Figure 7:
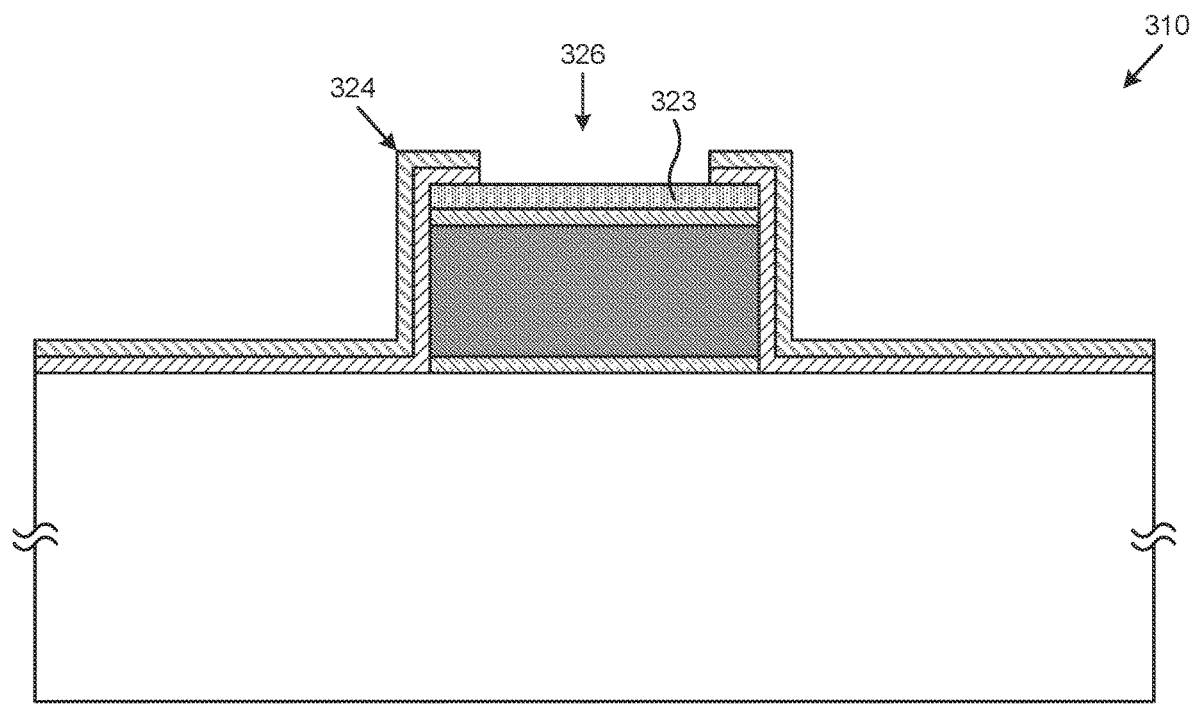
FIG. 7 illustrates a semiconductor structure processed in accordance with the flowchart of FIG. 1 according to one implementation of the present application.

FIG. 7 illustrates a semiconductor structure processed in accordance with action 210 in the flowchart of FIG. 2 according to one implementation of the present application. As shown in FIG. 7, in first substrate 310, window 326 is formed exposing a portion of solder bump receiving metal 323.

As shown in FIG. 7, window 326 exposes a portion of solder bump receiving metal 323 at a bottom surface of the passivation layer 324 (i.e., where the bottom surface of passivation layer 324 interfaces the top surface of solder bump receiving metal 323). Window 326 can be formed in passivation layer 324 by patterning passivation layer 324. For example, an isotropic dry plasma etch using sulfur hexafluoride ($SF_6$) can be utilized to form window 326. The width of window 326 can be chosen such that solder bump receiving metal 323 is slightly wider than the second substrate solder bump it is supposed to receive. In one implementation, the width of window 326 is approximately twenty-five microns (25 µm)

First substrate 310 in FIG. 7 is substantially complete after forming window 326. The exposed portion of solder bump receiving metal 323 is generally metallurgically compatible with a second substrate solder bump (not shown in FIG. 7). As a result, first substrate 310 is capable of electrically and mechanically connecting to a second substrate.

Figure 8:
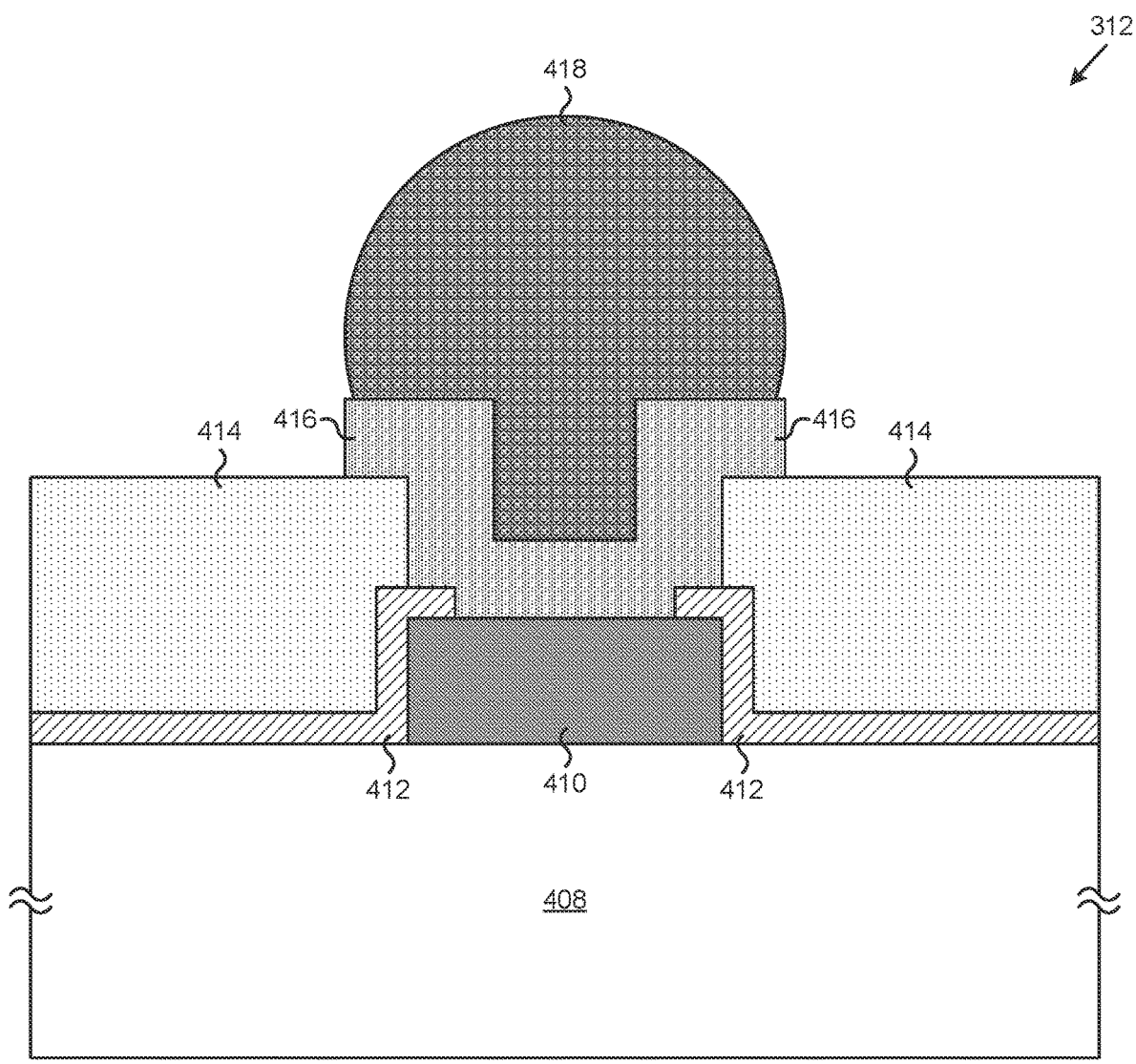
FIG. 8 illustrates a semiconductor structure processed in accordance with the flowchart of FIG. 1 according to one implementation of the present application.

FIG. 8 illustrates a semiconductor structure processed in accordance with action 212 in the flowchart of FIG. 2 according to one implementation of the present application.

As shown in FIG. 8, in second substrate 312 with second substrate solder bump 418 is provided.

Second substrate 312 includes lower substrate region 408, top interconnect metal 410, passivation layer 412, protective layer 414, UBM 416, and second substrate solder bump 418. Lower substrate region 408, top interconnect metal 410, passivation layer 412, protective layer 414, and UBM 416 in FIG. 8 generally correspond to lower substrate region 108, top interconnect metal 110, passivation layer 112, protective layer 114, and UBM 116 in FIG. 1 and may have any implementations described above. Similarly, second substrate solder bump 418 in FIG. 8 generally correspond to second substrate solder bumps 104 in FIG. 1 and may have any implementations described above. For example, second substrate solder bump 418 can be a gold alloy or a silver alloy, such as AuSn or AgSn. It is noted that only a portion of second substrate 312 is illustrated in FIG. 8. Second substrate 312 may be larger and may have more second substrate solder bumps than shown.

Figure 9:
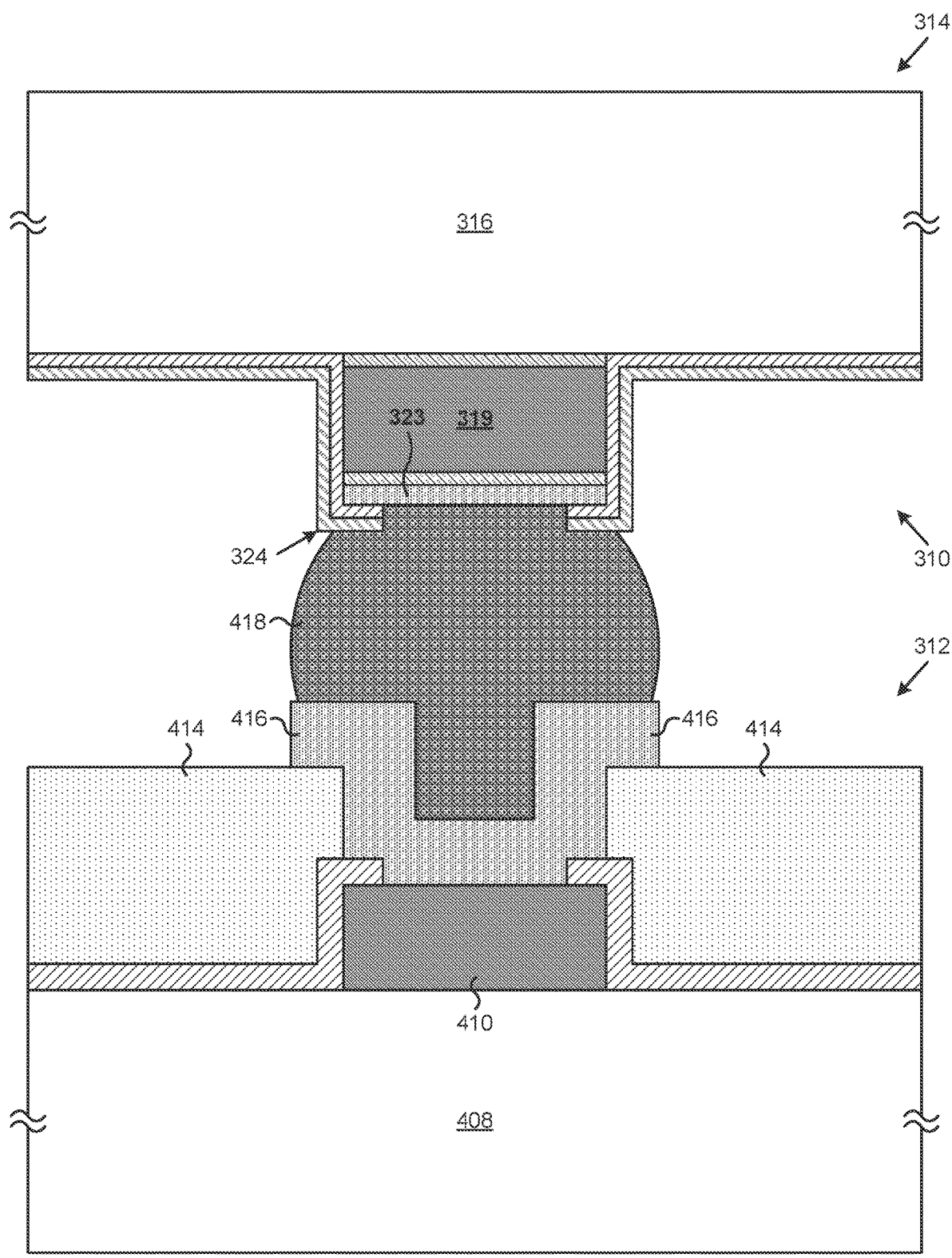
FIG. 9 illustrates a semiconductor structure processed in accordance with the flowchart of FIG. 1 according to one implementation of the present application.

FIG. 9 illustrates a semiconductor structure processed in accordance with action 214 in the flowchart of FIG. 2 according to one implementation of the present application. As shown in FIG. 9, in semiconductor structure 314, second substrate solder bump 418 is mechanically and electrically connected to solder bump receiving metal 323 of first substrate 310. In particular, second substrate solder bump 418 is directly connected to the exposed portion of solder bump receiving metal 323.

Second substrate solder bump 418 can be connected to solder bump receiving metal 323 using any connection technique known in the art. In one implementation, first substrate 310 is flipped, second substrate solder bump 418 is aligned with solder bump receiving metal 323, and a solder reflow is performed. In semiconductor structure 314 in FIG. 9, electricity can be routed to and from the path created by lower substrate region 316, top interconnect metal 319, solder bump receiving metal 323, second substrate solder bump 418, UBM 416, top interconnect metal 410, and lower substrate region 408. Such electrical routing can assist with pixel readout, signal processing, memory storage, etc.

Notably, in second substrate 312, second substrate solder bump 418 is mechanically and electrically connected to UBM 416 of second substrate 312, whereas in first substrate 310, second substrate solder bump 418 is mechanically and electrically connected to the exposed portion of solder bump receiving metal 323. Also, in second substrate 312, both protective layer 114 and passivation layer 112 are situated under portions of UBM 116, whereas in first substrate 310, passivation layer 324 is not situated under (or, given the reverse orientation in FIG. 9, "over") any portion of solder bump receiving metal 323. Further, second substrate 312 includes protective layer 414, whereas first substrate 310 does not include a corresponding layer. In one implementation, passivation layer 324 does not comprise polybenzoxazole (PBO), polyimide (PI), or benzocyclobutene (BCB).

Semiconductor structures according to the present invention, such as semiconductor structure 314 in FIG. 9, result in numerous advantages, some of which are stated below. First, semiconductor structure 314 greatly simplifies the fabrication process. In contrast to first substrate 100 in FIG. 1 that can add two additional deposition steps, two additional masking steps, and two addition patterning steps, first substrate 310 in FIG. 9 only adds one deposition step (as shown in FIG. 4). A deposition step for a protective layer, such as an organic dielectric or polymer, can be omitted. No additional masking steps are needed and no additional etching steps are needed, since the solder bump receiving metal 323 and top interconnect metal 319 can be substantially concurrently patterned (as shown in FIG. 5).

Second, solder bump receiving metal 323 and passivation layer 324 can comprise materials typically used in CMOS foundries. First substrate 310 can omit metals, such as Au, Ag, and Cr, and organic dielectrics or polymers, such as PBO, PI, or BCB, which may not be readily available in a CMOS foundry. Accordingly, first substrate 310 need not be transferred to a second specialized foundry in order to make first substrate 310 compatible with second substrate solder bumps 418.

Third, as a corollary to the first and second advantages above, first substrate 310 can shave off time, approximately on the scale of months, from the fabrication process. Fourth, solder bump receiving metal 323 can prevent oxidation during transfer of first substrate 310 prior to connection to second substrate solder bumps 418. Fifth, solder bump receiving metal 323 is compatible with a variety of solder bumping techniques, including both flip-chip and wirebonding techniques. Sixth, by omitting rather large layers like protective layer 114 and UBM 116 (shown in FIG. 1), the form factor of first substrate 310 and the pitch of solder bump receiving metal 323 is generally reduced.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method of forming a semiconductor structure, said method comprising:
   providing a first substrate without a solder bump;
   forming a solder bump receiving metal over a top interconnect metal of said first substrate, said solder bump receiving metal being selected from the group consisting of platinum, a platinum alloy, nickel, and a nickel alloy;
   forming a passivation layer, wherein said passivation layer is not situated under any portion of said solder bump receiving metal;
   forming a window exposing a portion of said solder bump receiving metal;
   wherein after processing of said first substrate, said exposed portion of said solder bump receiving metal is capable to electrically and directly mechanically connect to a second substrate.

2. The method of claim 1 further comprising:
   providing said second substrate with a second substrate solder bump;
   directly mechanically and electrically connecting said second substrate solder bump to said solder bump receiving metal of said first substrate.

3. The method of claim 2, wherein said second substrate solder bump is mechanically and electrically connected to an under-bump metallization (UBM) of said second substrate.

4. The method of claim 2, wherein said second substrate solder bump comprises gold (Au) and/or silver (Ag).

5. The method of claim 1, wherein said forming said solder bump receiving metal over said top interconnect metal of said first substrate comprises:
   forming a solder bump receiving metal layer over a top interconnect metal layer;
   substantially concurrently patterning said solder bump receiving metal layer and said top interconnect metal layer.

6. The method of claim 1, wherein said solder bump receiving metal has a thickness of between approximately one hundred angstroms (100 Å) and one thousand angstroms (1,000 Å).

7. The method of claim 1, wherein said passivation layer comprises an oxide layer and/or a nitride layer.

8. The method of claim 1, wherein said passivation layer does not comprise polybenzoxazole (PBO), polyimide (PI), or benzocyclobutene (BCB).

9. A semiconductor structure including a first substrate capable of electrically and mechanically connecting to a second substrate, said semiconductor structure comprising:
   said first substrate without a solder bump;
   a solder bump receiving metal over a top interconnect metal of said first substrate, said solder bump receiving metal being selected from the group consisting of platinum, a platinum alloy, nickel, and a nickel alloy;
   a window exposing a portion of said solder bump receiving metal;
   said exposed portion of said solder bump receiving metal being capable to electrically and directly mechanically connect to said second substrate;
   a passivation layer, wherein said passivation layer is not situated under any portion of said solder bump receiving metal.

10. The semiconductor structure of claim 9, wherein said solder bump receiving metal and said top interconnect metal have approximately the same width.

11. The semiconductor structure of claim 9, wherein said solder bump receiving metal has a thickness of between approximately one hundred angstroms (100 Å) and one thousand angstroms (1,000 Å).

12. The semiconductor structure of claim 9, wherein said passivation layer comprises an oxide layer and/or a nitride layer.

13. The semiconductor structure of claim 9, wherein said passivation layer does not comprise polybenzoxazole (PBO), polyimide (PI), or benzocyclobutene (BCB).

14. A semiconductor structure including a first substrate electrically and mechanically connected to a second substrate, said semiconductor structure comprising:
   a solder bump receiving metal over a top interconnect metal of said first substrate;
   a window exposing a portion of said solder bump receiving metal of said first substrate;
   a passivation layer, wherein said passivation layer is not situated under any portion of said solder bump receiving metal;
   a second substrate solder bump directly mechanically and electrically connected to said exposed portion of said solder bump receiving metal of said first substrate.

15. The semiconductor structure of claim 14, wherein said second substrate solder bump is mechanically and electrically connected to an under-bump metallization (UBM) of said second substrate.

16. The semiconductor structure of claim 14, wherein said second substrate solder bump comprises gold (Au) and/or silver (Ag).

17. The semiconductor structure of claim 14, wherein said solder bump receiving metal and said top interconnect metal have approximately the same width.

18. The semiconductor structure of claim 14, wherein said solder bump receiving metal has a thickness of between approximately one hundred angstroms (100 Å) and one thousand angstroms (1,000 Å).

19. The semiconductor structure of claim 14, wherein said passivation layer comprises an oxide layer and/or a nitride layer.

20. The semiconductor structure of claim 14, wherein said passivation layer does not comprise polybenzoxazole (PBO), polyimide (PI), or benzocyclobutene (BCB).

* * * * *